(12) United States Patent
Herner et al.

(10) Patent No.: US 7,888,205 B2
(45) Date of Patent: Feb. 15, 2011

(54) HIGHLY SCALABLE THIN FILM TRANSISTOR

(75) Inventors: S. Brad Herner, San Jose, CA (US); Abhijit Bandyopadhyay, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 12/659,480

(22) Filed: Mar. 10, 2010

(65) Prior Publication Data

US 2010/0173457 A1 Jul. 8, 2010

Related U.S. Application Data

(62) Division of application No. 11/765,269, filed on Jun. 19, 2007, now abandoned.

(51) Int. Cl.
*H01L 21/336* (2006.01)
(52) U.S. Cl. .............................. 438/258; 257/E21.421
(58) Field of Classification Search ............. 438/258; 257/E21.421
See application file for complete search history.

(56) References Cited

U.S. PATENT DOCUMENTS

| | | | |
|---|---|---|---|
| 5,915,167 | A | 6/1999 | Leedy |
| 6,185,122 | B1 | 2/2001 | Johnson et al. |
| 6,815,077 | B1 | 11/2004 | Herner et al. |
| 6,852,645 | B2 * | 2/2005 | Colombo et al. ............ 438/770 |
| 6,858,899 | B2 | 2/2005 | Mahajani et al. |
| 6,881,994 | B2 | 4/2005 | Lee et al. |
| 6,951,780 | B1 * | 10/2005 | Herner ........................ 438/128 |
| 6,952,030 | B2 | 10/2005 | Herner et al. |
| 7,005,350 | B2 | 2/2006 | Walker et al. |
| 7,012,299 | B2 | 3/2006 | Mahajani et al. |
| 7,224,013 | B2 | 5/2007 | Herner et al. |
| 7,537,968 | B2 | 5/2009 | Herner |
| 2004/0206996 | A1 | 10/2004 | Lee et al. |

(Continued)

FOREIGN PATENT DOCUMENTS

WO 03/017285 A1 2/2003

(Continued)

OTHER PUBLICATIONS

International Search Report from corresponding International Application No. PCT/US2008/007532, 4 pgs., Oct. 13, 2008.

(Continued)

*Primary Examiner*—Steven J Fulk
(74) *Attorney, Agent, or Firm*—The Marbury Law Group PLLC (57) ABSTRACT

Shrinking the dimensions of PMOS or NMOS thin film transistors is limited by dopant diffusion. In these devices an undoped or lightly doped channel region is interposed between heavily doped source and drain regions. When the device is built with very short gate length, source and drain dopants will diffuse into the channel, potentially shorting it and ruining the device. A suite of innovations is described which may be used in various combinations to minimize dopant diffusion during fabrication of a PMOS or NMOS polycrystalline thin film transistor, resulting in a highly scalable thin film transistor. This transistor is particularly suitable for use in a monolithic three dimensional array of stacked device levels.

14 Claims, 3 Drawing Sheets

U.S. PATENT DOCUMENTS

| | | | |
|---|---|---|---|
| 2004/0245577 A1* | 12/2004 | Bhattacharyya | 257/369 |
| 2005/0052915 A1 | 3/2005 | Herner et al. | |
| 2006/0049449 A1 | 3/2006 | Iino et al. | |
| 2006/0073657 A1 | 4/2006 | Herner et al. | |
| 2006/0087005 A1 | 4/2006 | Herner et al. | |
| 2006/0205124 A1* | 9/2006 | Herner | 438/149 |
| 2006/0249753 A1 | 11/2006 | Herner et al. | |
| 2006/0250836 A1 | 11/2006 | Herner et al. | |
| 2006/0250837 A1 | 11/2006 | Herner et al. | |
| 2006/0273298 A1 | 12/2006 | Petti | |
| 2006/0292301 A1 | 12/2006 | Herner | |
| 2007/0134876 A1 | 6/2007 | Lai et al. | |
| 2007/0190722 A1 | 8/2007 | Herner | |
| 2007/0228414 A1 | 10/2007 | Kumar et al. | |
| 2007/0246764 A1 | 10/2007 | Herner | |
| 2008/0003793 A1 | 1/2008 | Herner et al. | |
| 2008/0318397 A1 | 12/2008 | Herner | |

FOREIGN PATENT DOCUMENTS

| | | |
|---|---|---|
| WO | 2006/130800 A2 | 12/2006 |
| WO | 2008/156756 A1 | 12/2008 |

OTHER PUBLICATIONS

Adachi, K. et al., "Issue & Optimization of Millisecond Anneal Process for 45nm Node and Beyond," Symposium on VLSI Technology Digest or Technical Papers, 2005, pp. 142-143.

Bang, D.S. et al., "Resistivity of Boron & Phosphorus Doped Polycrystalline Si1-xGex Films," Appl. Phys. Lett. 66 (2), Jan. 9, 1995, pp. 195-197.

Eguchi, S. et al., "Comparison of Arsenic & Phosphorus Diffusion Behavoir in Silicon-Germanium Alloys," Applied Physics Letters, Mar. 2002, pp. 1743-1745, vol. 80, No. 10.

Girginoudi, S. et al., "Electrical & Structural Properties of Poly-Si Films Grown by Furnace & Rapid Thermal Annealing of Amorphous Si," Journal of Applied Physics, Aug. 1998, pp. 1968-1972, vol. 84, No. 4.

Hatalis, M. K., "Large Grain Polycrystalline Silicon by Low-Temperature Annealing of Low-Pressure Chemical Vapor Deposited Amorphous Silicon Films," Journal of Applied Physics, Apr. 1998, pp. 2260-2266, vol. 63, No. 7.

Park, K. J. et al., "Bulk & Interface Charge in Low Temperature Silicon Nitride for Thin Film Transistors on Plastic Substrates," J. Vac. Sci, Technol. A, Nov.-Dec. 2004, pp. 2256-2260, vol. 22, No. 6.

Rajendran, B. et al., "Low Thermal Budget Processing for Sequential 3-D IC Fabrication," IEEE Transactions of Electron Devices, Apr. 2007, pp. 707-714, vol. 54, No. 4.

Rittersma, Z.M. et al., "Characterization of Thermal & Electrical Stability of MOCVD HfO2HfSiO4 Dielectric Layers with Polysilicon Electrodes for Advanced CMOS Technologies," Journal of the Electrochemical Society, 2004, pp. G870-G877, vol. 151, No. 12.

Smith, J. et al., "Pattern-Dependent Microloading & Step Coverage of Silicon Nitride Thin Films Deposited in a Single-Wafer Thermal Chemical Vapor Deposition Chamber," J. Vac. Sci. Technol. B., Nov.-Dec. 2005, pp. 2340-2346, vol. 23, No. 6.

Wolf, S. et al., "Silicon Processing for the VLSI Era," Implanting Into Single Crystal Materials: Channeling, 1986, pp. 292-296, vol. 1, Lattice Press.

* cited by examiner

HIGHLY SCALABLE THIN FILM TRANSISTOR

RELATED APPLICATIONS

This application is a divisional of U.S. application Ser. No. 11/765,269, filed Jun. 19, 2007 which is hereby incorporated by reference in its entirety.

BACKGROUND OF THE INVENTION

A field effect transistor (FET) has an undoped or very lightly doped channel region disposed between heavily doped source and drain regions. When the gate length of a field effect transistor (FET) is very small, there is danger that source and drain dopants will diffuse into the channel during high-temperature processing steps, potentially shorting the channel.

This problem is particularly acute when multiple stacked device levels are formed above a substrate in monolithic three dimensional memory arrays, as in Walker et al., U.S. Pat. No. 7,005,350, "Method for Fabricating Programmable Memory Array Structures Incorporating Series-Connected Transistor Strings." In such a stacked array, each memory level may be subjected to repeated high-temperature steps, each causing more unwanted dopant diffusion.

There is a need, therefore, for a method to form a transistor, particularly a stackable thin film transistor, with minimal dopant diffusion.

SUMMARY OF THE PREFERRED EMBODIMENTS

The present invention is defined by the following claims, and nothing in this section should be taken as a limitation on those claims. In general, the invention is directed to a FET having its channel region in polycrystalline semiconductor material, the FET formed by a method minimizing dopant diffusion.

An aspect of the invention provides for a monolithic three dimensional array comprising: a first device level monolithically formed above a substrate, the first device level comprising a first plurality of field effect transistors, each field effect transistor having source, drain, and channel regions formed in a polycrystalline silicon-germanium layer, wherein the source and drain regions are doped with a p-type dopant; and a second device level monolithically formed above the first device level.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

To increase density and decrease cost, semiconductor devices are formed at ever smaller dimensions. Decreasing the dimensions of FETs is limited by channel length. This type of transistor includes a heavily doped source and drain which are separated by an undoped or lightly doped channel. Exposure to high temperature causes dopants to diffuse. When channel length is very short, dopants from the heavily doped source and drain may diffuse together, shorting the channel.

High-performance FETs are typically formed having channel regions in monocrystalline semiconductor material, generally the surface of a silicon wafer, which has no grain boundaries and few crystalline defects. Grain boundaries and crystalline defects reduce charge carrier mobility and slow operation of the device. Thin film transistors can be formed having channel regions in amorphous or polycrystalline semiconductor material. Thin film transistors having polycrystalline channel regions will be faster than those having amorphous channel regions, but the higher temperatures generally required to crystallize semiconductor material aggravates the problem of dopant diffusion.

It is known to form arrays of TFTs stacked above a substrate. A first device level is monolithically formed above the substrate, a second device level is monolithically formed above the first, and so on, forming a highly dense array. In addition to Walker et al, cited above, examples include Herner, US Patent Publication No. 20060205124, "Bottom-Gate SONOS-Type Cell Having a Silicide Gate," filed Mar. 11, 2005; and Petti et al., US Patent Publication No. 20060273298, "Rewriteable Memory Cell Comprising a Transistor and Resistance-Switching Material in Series," filed Jun. 2, 2005, both owned by the assignee of the present invention and hereby incorporated by reference. In some embodiments the stacked array is a monolithic three dimensional memory array, with each TFT operating as a memory cell.

Unwanted dopant diffusion is particularly problematic in such a stacked array. A first device level is subjected not only to any high-temperature steps required for its formation, but is additionally subjected to any high-temperature steps required to form the second level above it, the third level above that, and so forth. If dopant diffusion is extensive on lower device levels than on upper device levels, device performance may show undesirable variation between device levels.

In aspects of the present invention, a variety of techniques are combined to form TFTs while minimizing dopant diffusion. These techniques may all be used together, or a subset may be employed in any combination. The resulting TFTs are advantageously used when multiple monolithically formed device levels are to be stacked atop one another above a substrate, and will be useful in other applications as well. The various techniques of the present invention will now be described:

In FETs having polysilicon channels, defects and grain boundaries decrease mobility, and also tend to increase off current. Off current is the current which flows between the source and drain when the device is off, and should be minimized. By choosing to form the channel region of an advantageous blend of silicon-germanium instead of silicon, carrier mobility is improved without unacceptably increasing off current. Germanium crystallizes at lower temperature than silicon. Silicon and germanium are fully miscible, and the crystallization temperature of a silicon-germanium alloy is reduced with higher germanium content.

Phosphorus and other n-type dopants diffuse much more rapidly in germanium than in silicon, and n-type dopant diffusion is faster in a silicon-germanium alloy the higher its germanium content. There are generally two kinds of FETs, NMOS and PMOS. The heavily doped source and drain of an NMOS device are doped with an n-type dopant, typically phosphorus. NMOS is generally preferred, as n-type carriers have higher mobilities than p-type carriers, resulting in a faster device. If PMOS devices are formed in a FET having a silicon-germanium channel, the source and drain are doped with p-type dopants; p-type dopant diffusion is retarded in silicon-germanium compared to silicon. A TFT is necessarily a relatively lower-speed device than one formed having its channel region in monocrystalline silicon, and in many applications the loss of speed resulting from use of PMOS is acceptable.

Source and drain regions are typically doped by ion implantation. Ion channeling will cause dopant ions implanted into crystalline material to diffuse farther than if the dopant is implanted into amorphous material. In general, in TFTs that are polycrystalline in the completed device, a high-temperature step such as oxidation to form the gate oxide will cause the channel to crystallize by the time the implant is performed. By limiting temperature during all steps prior to ion implantation, it can be ensured that the channel will be largely amorphous when ion implantation is performed, minimizing dopant diffusion.

High temperature is required to crystallize the channel semiconductor material and activate dopants, but high temperature exacerbates dopant diffusion. In aspects of the present invention, a two-step anneal is used to crystallize the channel semiconductor material while minimizing dopant diffusion. A first long anneal, for example from about one to about 36 hours, preferably between about 18 to 30 hours, preferably about 24 hours, is performed at a relatively low temperature; the low-temperature anneal is performed at or just above the crystallization temperature of the semiconductor material to fully crystallize the channel layer. This produces larger grains, reducing the density of grain boundaries. Grain boundaries enhance dopant diffusion and reduce carrier mobility, so reducing grain boundary density reduces dopant diffusion and increases carrier mobility. The first slow, low-temperature anneal is followed by a second very short-duration, higher temperature anneal which activates dopants while minimizing dopant diffusion. The second anneal also serves to reduce the density of intragrain defects, improving carrier mobility and decreasing off current.

One typical high-temperature step performed during fabrication of an NMOS or PMOS device is an oxidation step to grow a high-quality gate oxide. This high-temperature step can be avoided by depositing a gate dielectric instead. It has been found, however, that deposited dielectrics result in a higher density of fixed surface charge on the semiconductor channel than when grown dielectrics are used. This fixed surface charge reduces carrier mobility. In aspects of the present invention, a hybrid gate dielectric, having two materials, is used. The first layer, a very thin dielectric, is grown on the channel surface, preferably by a low-temperature method, such as immersion in an oxygen-containing liquid ambient or by flowing concentrated $O_3$ over the semiconductor surface. This grown dielectric layer provides a clean interface to the channel, and is as thin as possible, for example about 20 angstroms or less; preferably five angstroms or less. The second layer is a deposited dielectric, preferably a high-k dielectric such as $HfO_2$, $Al_2O_3$, $ZrO_2$, $TiO_2$, $La_2O_3$, $Ta_2O_5$, $RuO_2$, $ZrSiO_x$, $AlSiO_x$, $HfSiO_x$, $HfAlO_x$, $HfSiON$, $ZrSiAlO_x$, $HfSiAlO_x$, $HfSiAlON$, and $ZrSiAlON$, or a blend of any of these materials. The high-k dielectric will have a dielectric constant greater than 8.

Thin film transistors using all or any combination of these innovations can be used in logic devices or in memory arrays. In a memory array, a thin film transistor of the present invention can operate in a memory cell in multiple ways; for example, it can serve either as a charge storage memory cell, such as a SONOS-type or floating gate memory cell, or can acting as a steering element in series with a resistance-switching element.

Two examples will be provided of devices formed using aspects of the present invention. These examples are provided for clarity, but are not intended to be limiting; it will be understood that every useful embodiment cannot practically be described, and many variations are possible.

The first example describes fabrication of thin film transistors with no charge storage region. These devices may serve as logic devices, or may serve as memory cells, for example by pairing each with a resistance-switching element. The second example describes fabrication of thin film transistors, each including a charge storage region. Such devices may serves a charge-storage memory cells.

First Example

Figure 1A:
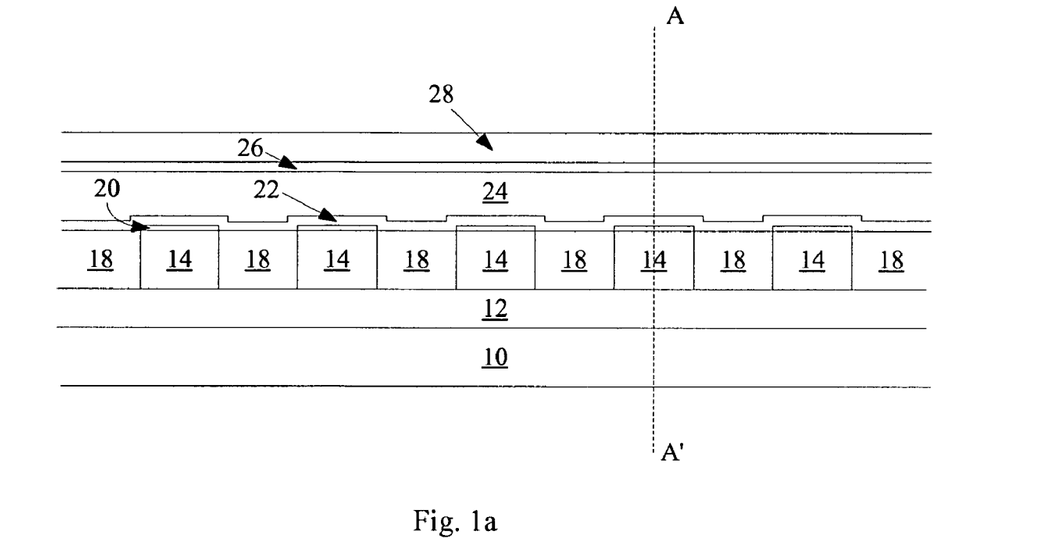
FIGS. 1a-1c are cross-sectional views showing stages in fabrication of a device level of transistors formed according to an embodiment of the present invention.

Fabrication begins on a suitable substrate. Turning to FIG. 1a, in some embodiments, substrate 10 may be a monocrystalline semiconductor substrate, for example a conventional silicon wafer. Control circuitry can be fabricated in the wafer substrate before fabrication of devices above the wafer begins. Alternatively, any other suitable substrate may be used, such as glass. Insulating layer 12 may be formed above substrate 10.

Channel layer 14 is deposited on insulating layer 12 by any conventional method, for example by chemical vapor deposition (CVD). Channel layer 14 is a semiconductor material, for example silicon, germanium, or silicon-germanium. In preferred embodiments, channel layer 14 is silicon-germanium, preferably between about 10 and about 40 atomic percent germanium, for example between about 10 and about 30 atomic percent germanium. In one embodiment, channel layer 14 is about 20 atomic percent germanium. Stated another way, channel layer 14 is $Si_xGe_{1-x}$, where x is between about 0.6 and about 0.9, preferably between about 0.75 and 0.85, preferably about 0.8. Channel layer 14 is preferably amorphous as deposited, and may be undoped or very lightly doped. Channel layer 14 is any appropriate thickness, for example between about 500 and about 2500 angstroms, for example about 1500 angstroms.

Channel layer 14 is patterned and etched into substantially parallel stripes using conventional methods, shown in cross-section, the stripes extending out of the page. An appropriate dielectric material 18 such as silicon dioxide is deposited over and between channel stripes 14, filling gaps between them. Overfill of dielectric material 18 is removed by planarization, for example by chemical mechanical planarization (CMP) or etchback to expose channel stripes 14 and dielectric material 18 at a substantially planar surface. If this planarization step is performed by CMP, some thickness, for example 500 angstroms, of channel layer 14 will be removed. In one embodiment, then, the remaining thickness of channel layer 14 is about 1000 angstroms.

The gate dielectric is formed next. In some embodiments, the gate dielectric may be a single layer of a dielectric material which is either deposited or grown. As described earlier, however, a hybrid gate dielectric, including a very thin grown dielectric layer and a thicker deposited high-k dielectric layer serves to improve mobility, while maximizing capacitance. Referring to FIG. 1a, a very thin dielectric layer 20 is grown on channel layer 14. It is advantageous to keep processing temperature at or below the temperature at which channel layer 14 begins to crystallize. If channel layer 14 is $Si_{0.8}Ge_{0.2}$, for example, it is preferred to keep temperature at or below about 560 degrees C., or to minimize the time for which that temperature is exceeded. Crystallization temperature decreases with higher germanium content.

In one embodiment, grown dielectric layer 20 is grown in a liquid ambient, for example by immersing the wafer in a chemical wet bath, preferably comprising $H_2O_2$ and a chemical that will contribute nitrogen, for example $NH_4OH$. A dip of about 5 minutes at about 55 degrees C., for example, will form a silicon dioxide film about 4.7 angstroms thick. This film includes small amounts of nitrogen. This included nitrogen affords the additional advantage that it tends to inhibit dopant diffusion, for example between the control gate still to be formed and channel layer 14.

In another embodiment, grown dielectric layer 20 is grown by flowing highly concentrated (e.g. more than 93 percent by volume) $O_3$, at a flow rate of, for example, 20 sccm, over the surface of channel layer 14 at temperatures between about 260 and about 520 degrees, for example about 330 degrees. Grown dielectric layer 20 is as thin as possible, for example about 5 angstroms. The thickness of grown dielectric layer 20 is exaggerated to allow it to be visible, and is not shown to scale. Note that grown dielectric layer 20 is formed by oxidizing the semiconductor material of channel stripes 14, and thus is grown only on channel stripes 14, not between them.

Next the gate dielectric is completed by depositing a high-k dielectric layer 22, preferably by atomic layer deposition (ALD). High-k dielectric layer 22 may be, for example, $HfO_2$, $Al_2O_3$, $ZrO_2$, $TiO_2$, $La_2O_3$, $Ta_2O_5$, $RuO_2$, $ZrSiO_x$, $AlSiO_x$, $HfSiO_x$, $HfAlO_x$, HfSiON, $ZrSiAlO_x$, $HfSiAlO_x$, HfSiAlON, and ZrSiAlON, or a blend of any of these materials. In some embodiments, $HfSiO_2$ is preferred for high-k dielectric layer 22. High-k dielectric layer 22 should be formed having a thickness such that the gate capacitance is equivalent to that of a silicon dioxide layer about 100 angstroms thick, though a thinner or thicker gate oxide may be preferred.

A stack to form the control gate is deposited. Any appropriate material or materials can be used. In preferred embodiments, the stack begins with layer 24, which is heavily doped polysilicon in situ doped with a p-type dopant such as boron, for example by flowing $BCl_3$ along with $SiH_4$ during deposition. Temperature is preferably maintained below 500 degrees C. while layer 24 is deposited. Doping layer 24 in situ provides a high level of active dopant. In general, p-type dopants tend to promote crystallization; thus this layer will be polycrystalline as deposited.

In this embodiment, layers 26 and 28 complete the gate stack. Layer 26 is a thin layer of tungsten nitride, for example about 100 angstroms, which serves as an adhesion layer, while layer 28 is preferably tungsten, for example about 500 angstroms. The structure at this point is shown in FIG. 1a.

Figure 1B:
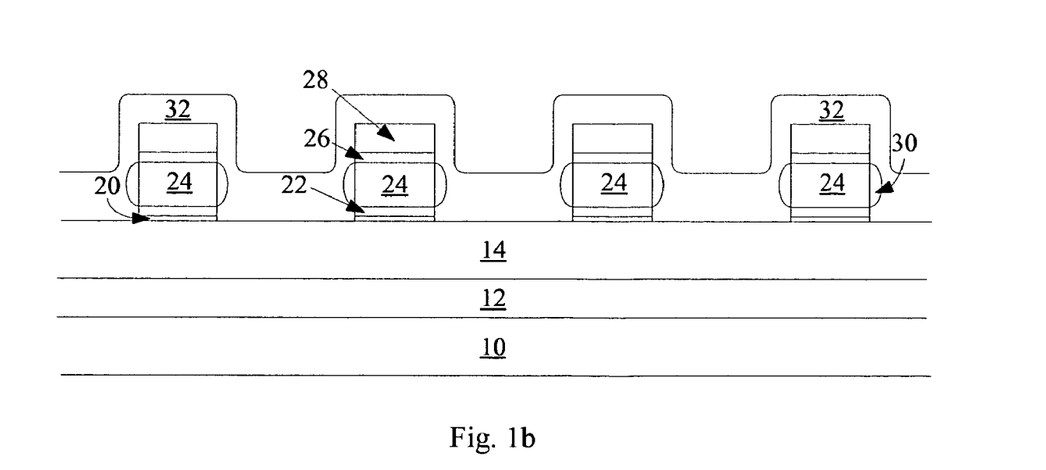

Turning to FIG. 1b, layers 28, 26, and 24 are patterned and etched into lines, forming control gates, which extend substantially perpendicular to channel stripes 14. Gate dielectric layers 22 and 20 will generally be etched as well. The view of FIG. 1b is rotated 90 degrees relative to the view of FIG. 1a along dotted line A-A' of FIG. 1a; in FIG. 1b a channel stripe 14 is shown in cross-section, extending left-to-right across the page. The surface of silicon layer 24 is oxidized to form oxide 30. This oxidation step is performed in conditions that will selectively oxidize silicon but will not oxidize tungsten 28 or tungsten nitride 26, as described in Herner, U.S. Pat. No. 6,951,780, "Selective Oxidation of Silicon in Diode, TFT, and Monolithic Three Dimensional Memory Arrays," hereby incorporated by reference. To achieve this selective oxidation, the ratio of partial pressure of $H_2$ to partial pressure of $H_2O$ should be at least about 3:1. Preferably, between about 30,000 and 7200 sccm, most preferably about 15,000 sccm of $H_2$, and about 700 sccm of $O_2$ are provided. The flow rate of $O_2$ can be increased or decreased as desired, for example from between about 3000 to about 500 sccm, so long as an appropriate ratio to $H_2$ is maintained. $H_2$ and $O_2$ are reacted together in the chamber to form steam ($H_2O$) in situ. The temperature is preferably between about about 500 and 560 degrees C., most preferably about 520 degrees C., while pressure is maintained between about 50 and about 760 Torr, most preferably at about 760 Torr. Thickness of the oxide 30 grown in this oxidation step may be, for example, about 100 angstroms. In alternative embodiments layer 30 could be deposited.

A layer 32 of a dielectric such as silicon nitride is deposited next. Layer 32 is preferably deposited at or below the crystallization temperature of the silicon-germanium of channel stripe 14. Various low-temperature methods of depositing silicon nitride are known. Using a bis(tertiary-butylamino) silane (BTBAS) precursor, silicon nitride layer 32 can be deposited to a thickness of, for example, about 500 degrees C. Alternatively, silicon nitride may be deposited by flowing silane, $NH_3$ and $N_2$, while maintaining the ammonia/silane ratio between 3.75 and 15, with substrate temperature ranging from 50 to 350 degrees C., as described in Park et al., "Bulk and interface charge in low temperature silicon nitride for thin film transistors on plastic substrates," J. Vac. Sci. Technol. A 22(6) November/December 2004, pp. 2256-2260. Still another low-temperature method to form silicon nitride is described by Smith et al., "Pattern-dependent microloading and step coverage of silicon nitride thin films deposited in a single-wafer thermal chemical vapor deposition chamber," J. Vac. Sci. Technol. B 23(6) November/December 2005, pp. 2340-2346. Silicon nitride layer 32 may have a thickness of, for example, about 500 angstroms.

Figure 1C:
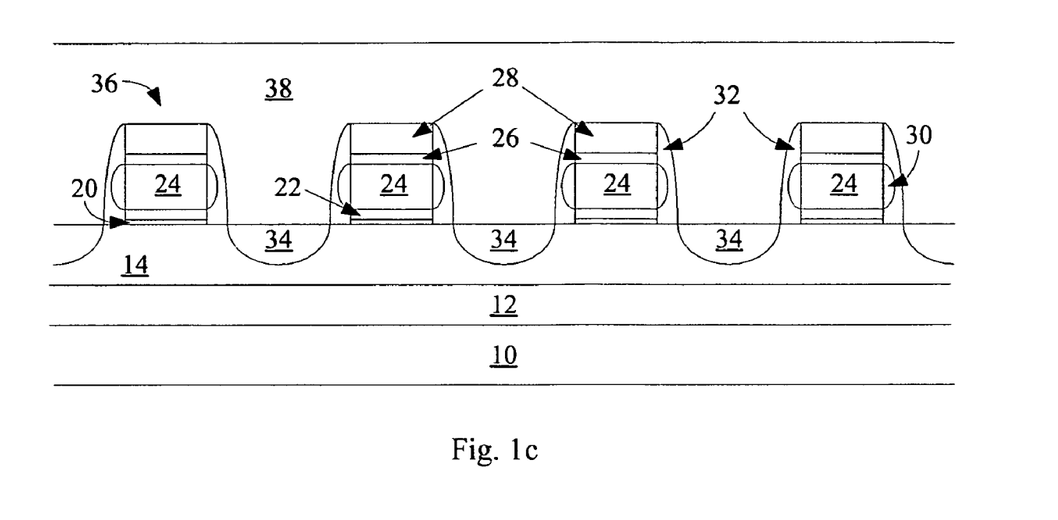

Turning to FIG. 1c, an anisotropic etch is performed on silicon nitride layer 32 and silicon dioxide layer 30 to form sidewall spacers. In some embodiments, however, layers 30 and 32 may not be formed, and sidewall spacers may be omitted.

Next source and drain regions 34 are formed in channel stripe 14 by ion implantation. Either an n-type or a p-type dopant may be implanted, forming either NMOS or PMOS, respectively. Diffusion of phosphorus and other common n-type dopants is enhanced with germanium content; thus if channel stripe 14 is formed of silicon-germanium, use of a p-type dopant may be preferred, forming PMOS. In one embodiment, $BF_2$ is implanted at an implantation energy of 5 keV to a dose of about $1 \times 10^{15}/cm^3$. In alternative embodiments, NMOS may be formed by implanting an n-type dopant instead. The silicon-germanium of channel stripe 14 is entirely or predominantly amorphous during this implantation step, limiting dopant diffusion through ion channeling.

Next an appropriate dielectric material 38 such as silicon dioxide is deposited over and between PMOS transistors 36, filling gaps between them. Silicon dioxide layer 38 is preferably planarized, for example by CMP, to form a planar surface at the top of silicon dioxide layer 38.

Figure 2:
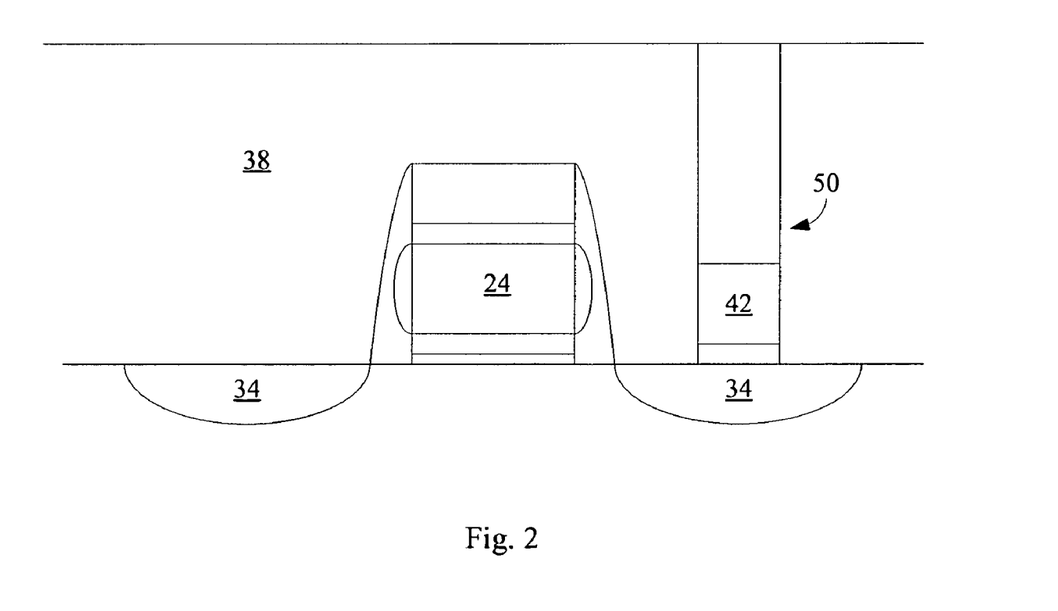
FIG. 2 is a cross-sectional view of a memory cell formed according to an embodiment of the present invention.

Memory cells can be formed by fabricating a resistance-switching element in series with each transistor 36. As shown in FIG. 2, this resistance-switching element 42 can be formed in a via 50 making contact to source or drain 34. Resistance switching element 42 can include a resistivity-switching material such as a binary metal oxide or nitride (such as NiO, CoO, $Nb_2O_5$, $TiO_2$, $HfO_2$, $Al_2O_3$, $MgO_x$, $CrO_2$, VO, BN, AlN, etc.) as described in Petti et al., U.S. patent application Ser. No. 11/143,269, "Rewriteable Memory Cell Comprising a Transistor and Resistance-Switching Material in Series," filed Jun. 2, 2005; a carbon nanotube fabric, as in Herner et al., U.S. patent application Ser. No. 11/692,144, "Method to Form a Memory Cell Comprising a Carbon Nanotube Fabric Element and a Steering Element," filed Mar. 27, 2007, owned by the assignee of the present invention and hereby incorporated by reference; or, alternatively, a chalcogenide, perovskite, etc.

Fabrication of a second memory level can begin on the planar surface of silicon dioxide layer 38 formed by CMP, and additional levels monolithically formed above this second level. Preferably all process steps to fabricate these device levels are performed at a temperature at or below the crystallization temperature of the semiconductor material of channel stripes 14, for example at or below about 560 degrees C. if channel stripe 14 is $Si_{0.8}Ge_{0.2}$. Once fabrication of all device levels has been completed, a crystallizing anneal is performed to crystallize the semiconductor material in all device levels. This anneal is preferably a two-stage anneal.

Grain size is maximized and diffusion minimized by performing a slow anneal at relatively low temperature. For example, for a $Si_{0.8}Ge_{0.2}$ alloy, the crystallizing anneal may be at a temperature between about 450 and 650 degrees for between about 30 minutes and 36 hours, preferably at about 560 degrees for about 24 hours.

In preferred embodiments, a second very short, high-temperature anneal is performed to activate source and drain dopants and reduce crystalline defect density. Temperature for this anneal should be ramped very quickly, for example at 200 degrees/second, to the anneal temperature, for example between about 650 and 800 degrees C., for example about 800 degrees C., then maintained at temperature for a very short time, no more than 120 seconds, preferably from zero to 10 seconds, before being rapidly cooled. This anneal will tend to reduce the density of intragrain defects in the polycrystalline semiconductor material of channel stripes 14, reducing leakage current and improving carrier mobility. In other embodiments this high-temperature anneal may be omitted.

In alternative embodiments, no memory element is included and transistors 36 serve as logic devices, for example as control logic for a TFT display.

Second Example

A second example will be provided of an embodiment of the present invention. In the second example, a charge storage element is formed between the channel region and the control gate, forming a charge storage memory cell.

Figure 3:
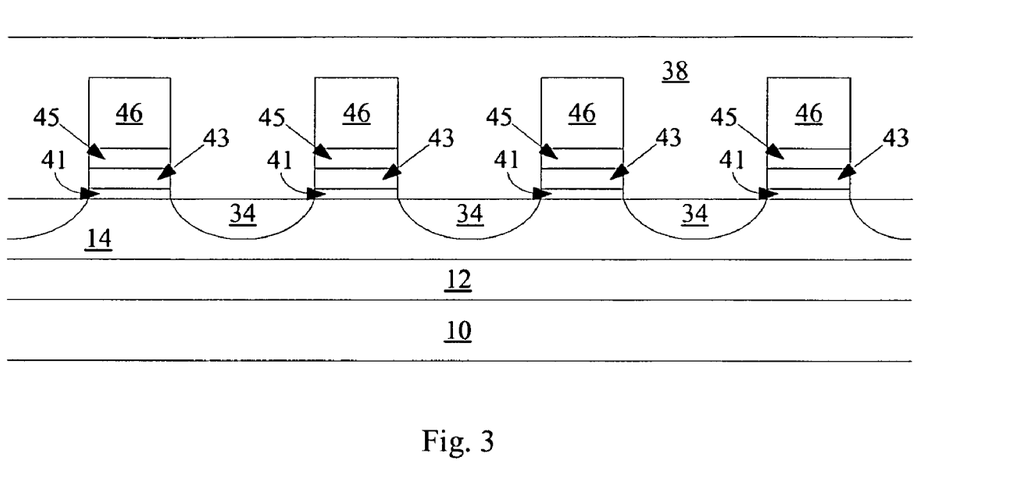
FIG. 3 is a cross-sectional view of a memory cell formed according to an embodiment of the present invention.

Turning to FIG. 3, fabrication begins as in the first example, with channel stripes 14 and dielectric material 18 formed above substrate 10 and dielectric 12, and exposed at a planar surface, for example by CMP. Channel stripes 14 may be formed of the same semiconductor materials named in the prior example, such as silicon-germanium. The view of FIG. 3 is in the same orientation as the view of FIG. 1b, viewing channel stripe 14 in cross-section extending left-to-right across the page.

Tunneling dielectric 41 is formed on this planar surface. This layer is preferably a thin, high-quality dielectric which will allow Fowler-Nordheim tunneling while the memory cell is being programmed and erased, but will prevent loss of charge in a programmed cell. In one embodiment, tunneling dielectric 41 is a silicon dioxide layer deposited by ALD, and may be, for example, between about 25 and about 45 angstroms thick. Other appropriate dielectrics may be used. Deposition by ALD can be performed at relatively low temperature, well below the crystallization temperature of the semiconductor material of channel stripes 14.

Charge trapping dielectric 43 is formed on tunneling dielectric 41. Charge trapping dielectric 43 can be silicon nitride formed at or below 560 degrees C. using a BTBAS precursor, as in the prior example, or using some other method which can be performed at or below the crystallization temperature of the semiconductor material of channel stripes 14. Charge trapping dielectric 43 may have any appropriate thickness, for example, about 50 to about 100 angstroms.

Blocking dielectric 45 is formed next. This layer can be an appropriate dielectric, for example $Al_2O_3$ or silicon dioxide. Blocking dielectric 45 is preferably formed by a low temperature method such as ALD, as before keeping processing temperatures low enough to avoid crystallizing channel stripes 14.

The layers to form control gate 46 are deposited as in the prior example. Alternatively, a metal gate may be preferred, for example including tantalum nitride, tungsten nitride, tungsten, etc., or a combination. Once the control gate layers have been deposited, these layers are patterned and etched into substantially parallel lines, forming control gates 46 which preferably extend substantially perpendicular to channel stripes 14. Layers 45, 43, and 41 are preferably etched as well. Sidewall spacers may be formed as in the prior example, or may be omitted.

Source and drain 34 are formed in channel stripe 14 by ion implantation as in the prior example. Either a p-type or an n-type dopant may be implanted. As noted earlier, p-type dopants such as boron diffuse more slowly in a silicon-germanium alloy than do n-type dopants such as phosphorus. As in the prior example, the semiconductor material of channel stripe 14 is preferably entirely or predominantly amorphous during this implantation step.

Dielectric material 38 is deposited over and between the transistors just formed. Dielectric material 38 is planarized, for example by CMP, and fabrication of a second memory level can begin on this planarized dielectric surface. Additional memory levels can be monolithically formed above the first two memory levels.

Once fabrication of all memory levels has been completed, a crystallizing anneal crystallizes the semiconductor material of channel stripes 14 on all memory levels, as in the first example. As before, it is preferred to perform a first slow, low-temperature anneal, followed by a short, high-temperature anneal to activate dopants and repair intragrain defects.

The charge-storage memory cell just described is a SONOS-type memory cell. A conventional SONOS memory cell includes a silicon channel region, a tunneling dielectric of silicon dioxide, a trapping dielectric of silicon nitride, a blocking dielectric of silicon dioxide, and a polycrystalline silicon control gate. This silicon-oxide-nitride-oxide-silicon structure gives the SONOS memory cell its name. In the erased state, a SONOS memory cell turns on when a first threshold voltage is applied to the control gate. When the cell is programmed, charge carriers are trapped in the silicon nitride layer. The trapped charge carriers change the threshold voltage of the transistor. The changed threshold voltage allows a programmed cell to be distinguished from an unprogrammed cell. A memory cell operating in this manner, by storing charge in a dielectric charge storage region, will be called a SONOS-type memory cell, and can be formed of other materials than a conventional SONOS memory cell. Silicon-germanium can be substituted for the silicon of the channel, for example; the control gate may be metal rather than polycrystalline silicon; other dielectrics may be substituted for silicon dioxide and silicon nitride, etc.

In a SONOS-type memory cell, charge is stored in a dielectric layer. In another type of charge-storage memory cell, a floating gate memory cell, charge is stored in a floating gate, a heavily doped semiconductor body which is electrically isolated from all surrounding elements. In embodiments of the present invention, the trapping dielectric of the SONOS-type memory cell just described can be replaced with a floating gate, forming a floating gate memory cell.

To summarize, in both the memory and non-memory examples provided, a monolithic three dimensional device is formed by depositing a first layer of semiconductor material above a substrate, wherein the first layer of semiconductor material is amorphous as deposited; forming a first plurality of field effect transistors, each first field effect transistor having a channel region comprising a portion of the first layer of semiconductor material; depositing a second layer of semiconductor material above the first field effect transistors, wherein, when the second layer of semiconductor material is deposited, the first layer of semiconductor material remains predominantly amorphous; forming a second plurality of field effect transistors, each second field effect transistor having a channel region comprising a portion of the second layer of semiconductor material; and annealing, wherein, after the annealing step, the first layer of semiconductor material and the second layer of semiconductor material are polycrystalline.

In aspects of the present invention, then, a first field effect transistor is formed by depositing a first amorphous layer of silicon-germanium; performing ion implantation to form first source and drain regions for a first field effect transistor in the first layer of silicon-germanium, wherein the first layer of silicon-germanium is amorphous during the ion implantation step; and annealing the first layer of silicon-germanium, wherein, after the annealing step, the first layer of silicon-germanium is polycrystalline. In some embodiments, the first field effect transistor is a memory cell comprising a channel region and the first source and drain regions formed in the first layer of silicon-germanium; and a charge storage region.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming a monolithic three dimensional device, the method comprising:
depositing a first semiconductor material layer above a substrate, wherein the first semiconductor material layer is amorphous as deposited and comprises silicon-germanium alloy;
forming a first plurality of field effect transistors, each first field effect transistor having a first channel region comprising a portion of the first layer of semiconductor material;
depositing a second semiconductor material layer above the first field effect transistors, wherein, when the second semiconductor material layer is deposited, the first layer of semiconductor material remains predominantly amorphous; and
forming a second plurality of field effect transistors, each second field effect transistor having a second channel region comprising a portion of the second layer of semiconductor material;
wherein:
the step of forming the first plurality of field effect transistors comprises growing an oxide layer between the first channel region and a gate electrode of the first plurality of field effect transistors transistor, and depositing a high-k dielectric layer having a dielectric constant greater than 8 on and in contact with the oxide layer.

2. The method of claim 1, wherein the semiconductor material is $Si_xGe_{1-x}$, and wherein x is between about 0.6 and about 0.9.

3. The method of claim 2, wherein x is between about 0.75 and about 0.85.

4. The method of claim 1, wherein each of the first plurality of field effect transistors or each of the second plurality of field effect transistors is a PMOS transistor.

5. The method of claim 1, further comprising an annealing step after the step of forming the second plurality of field effect transistors, the annealing step comprising:
a first annealing stage performed at between about 450 and about 650° C. for at least thirty minutes; and
a second annealing stage performed at between about 650 and about 800° C. for no more than 120 seconds.

6. The method of claim 5, wherein the first annealing stage lasts for about one hour to about 24 hours.

7. The method of claim 1, wherein each of the first plurality of field effect transistors is a memory cell comprising a charge storage region.

8. The method of claim 7, wherein the charge storage region comprises at least two oxides.

9. The method of claim 1, the step of growing an oxide layer comprises growing an oxide layer at a temperature less than or about 560° C. by oxidizing part of the first silicon-germanium semiconductor material layer.

10. The method of claim 1, wherein the high-k dielectric layer comprises $HfO_2$, $Al_2O_3$, $ZrO_2$, $TiO_2$, $La_2O_3$, $Ta_2O_5$, $RuO_2$, $ZrSiO_x$, $AlSiO_x$, $HfSiO_x$, $HfAlO_x$, $HfSiON$, $ZrSiAlO_x$, $HfSiAlO_x$, $HfSiAlON$, or $ZrSiAlON$.

11. The method of claim 1, wherein the oxide layer has a thickness of 20 angstroms or less.

12. The method of claim 1, wherein the substrate comprises monocrystalline silicon.

13. A method for forming a monolithic three dimensional device, the method comprising:

depositing a first layer of semiconductor material above a substrate, wherein the first layer of semiconductor material is amorphous as deposited;

forming a first plurality of field effect transistors, each first field effect transistor having a channel region comprising a portion of the first layer of semiconductor material;

depositing a second layer of semiconductor material above the first field effect transistors, wherein, when the second layer of semiconductor material is deposited, the first layer of semiconductor material remains predominantly amorphous;

forming a second plurality of field effect transistors, each second field effect transistor having a channel region comprising a portion of the second layer of semiconductor material; and recrystallizing the first and second layers of semiconductor material from amorphous form to polycrystalline form.

14. The method of claim 13, wherein the step of recrystallizing the first and second layers of semiconductor material comprises thermally annealing the first and second layers of semiconductor material.

* * * * *